(12) United States Patent
Wolf

(10) Patent No.: US 6,211,683 B1
(45) Date of Patent: Apr. 3, 2001

(54) IMPULSE VOLTAGE GENERATOR CIRCUIT

(75) Inventor: Jürgen Wolf, Weil am Rhein (DE)

(73) Assignee: Trench Switzerland AG, Basel (CH)

( * ) Notice: Subject to any disclaimer, the term of this patent is extended or adjusted under 35 U.S.C. 154(b) by 0 days.

(21) Appl. No.: 09/254,913

(22) PCT Filed: Sep. 16, 1997

(86) PCT No.: PCT/CH97/00341

§ 371 Date: Mar. 16, 1999

§ 102(e) Date: Mar. 16, 1999

(87) PCT Pub. No.: WO98/13701

PCT Pub. Date: Apr. 2, 1998

(30) Foreign Application Priority Data

Sep. 23, 1996 (DE) .............................................. 196 39 023

(51) Int. Cl.$^7$ .......................... G01R 31/12; G01R 17/16; H03K 3/00; H02H 3/22

(52) U.S. Cl. ........................ 324/548; 324/76.34; 307/108; 361/118

(58) Field of Search ................................ 324/548, 76.34; 307/110, 108; 333/20

(56) References Cited

U.S. PATENT DOCUMENTS

| | | | |
|---|---|---|---|
| 2,077,773 | * 4/1937 | Rorden | 324/548 |
| 4,829,256 | * 5/1989 | Yamagiwa | 324/538 |

FOREIGN PATENT DOCUMENTS

| | | |
|---|---|---|
| 238586 | 11/1945 | (CH) . |
| 376999 | 6/1964 | (CH) . |
| 547572 | 3/1974 | (CH) . |
| 455933 | 2/1928 | (DE) . |
| 491109 | 2/1930 | (DE) . |
| 502258 | 7/1930 | (DE) . |
| 892787 | 10/1953 | (DE) . |
| 913202 | 6/1954 | (DE) . |
| 958680 | 8/1956 | (DE) . |
| 1029091 | 4/1958 | (DE) . |
| 18249 | 2/1960 | (DE) . |
| 1223946 | 9/1966 | (DE) . |
| 1243779 | 7/1967 | (DE) . |
| 1938022 | 7/1970 | (DE) . |
| 2446387 | 1/1976 | (DE) . |

(List continued on next page.)

OTHER PUBLICATIONS

Hilgarth, Von Prof. Dr.–Ing. Günther—"Hochspannungstechnik", B.G. Teubner, Stuttgart, 1992, pp. 147–163.
Schultz, Heiko, Beitrag zur Verformung von Stoßspannungen durch kapazitätsbehaftete Vorwiderstände, Aus der Forschung etz–a Bd. 99, 1978, pp. 285–286.
Schwarzer, Von Jürgen, "Neue Stoßspannungsgeneratoren", Siemens–Zeitschrift 46, 1972, pp. 48–54.

Primary Examiner—Safet Metjahic
Assistant Examiner—Anjan K Deb
(74) Attorney, Agent, or Firm—Selitto & Associates (57) ABSTRACT

A pulsed-voltage generator circuit for producing a flash pulsed voltage for testing the capacitance of a unit under test has two stages (1, 2) which can be charged. Each stage (1, 2) comprises, connected in series, a surge capacitance (11, 21) and a switching spark gap (12, 22), a parallel resistor (13, 23) connected in parallel with the surge capacitance (11, 21) and the switching spark gap (12, 22), and, connected in series with them, a series resistor (14, 24). The two stages (1, 2) are connected to one another such that they can be charged connected in parallel and can be discharged connected in series. A load capacitance (4) is connected to the second stage (2), an additional circuit element (5) for reducing the overshoot of the pulse fronts of the flash pulsed voltage for the load capacitance (4) being arranged between the second stage (2) and the load capacitance (4). The additional circuit element (5) has a compensation capacitance (51) and, connected in parallel with it, a discharge resistor (52).

13 Claims, 5 Drawing Sheets

FOREIGN PATENT DOCUMENTS

| | | |
|---|---|---|
| 3529054 | 2/1986 | (DE) . |
| 4029989 | 3/1992 | (DE) . |
| 4030184 | 3/1992 | (DE) . |
| 4341924 | 6/1995 | (DE) . |
| 0750396 | 12/1996 | (EP) . |
| 789348 | 1/1958 | (GB) . |
| 2217856 | 11/1989 | (GB) . |
| 8910657 | 11/1989 | (WO) . |

\* cited by examiner

IMPULSE VOLTAGE GENERATOR CIRCUIT

FIELD OF THE INVENTION

The present invention relates to a pulsed-voltage generator (impulse voltage generator) circuit for producing a flash pulsed voltage for testing the capacitance of a unit under test.

BACKGROUND OF THE INVENTION

Objects which electrically represent a capacitance are widely tested using pulsed-voltage generators. The pulsed-voltage generators used are, in general, designed using the Marx multiplier circuit, which has been known since 1924 and has a plurality of stages which can be charged, in the case of which each stage has, connected in series, a surge capacitance and a switching device, in particular a switching spark gap, a parallel resistor connected in parallel with the surge capacitance and the switching device and, connected in series with them, a series resistor, and two stages are connected to one another such that they can be charged connected in parallel and can be discharged connected in series.

When testing the capacitance of a unit under test, the unit under test itself as well as a capacitive pulsed-voltage divider are in general connected to the last stage of the pulsed-voltage generator circuit, which pulsed-voltage divider reduces the flash pulsed voltage produced while the stages are being discharged to levels which can be processed by the measurement and recording devices. The capacitances of the unit under test and of the pulsed-voltage divider together with the existing parasitic capacitances form the load capacitance of the test circuit, which comprises the pulsed-voltage generator, the pulsed-voltage divider, the unit under test and the connecting leads and, in addition, because of the physical extent of the overall test arrangement, has unavoidable inductance. The load capacitance together with this inductance forms an oscillatory circuit, which is damped by the series resistors of the various stages which can be charged, the series resistors being also called end, front or damping resistors. In addition to damping, the series resistors are also used for adjusting the rise time of the voltage pulses to be produced. In order to achieve a desired rise time, the series resistors must be chosen to be smaller the greater the load capacitance.

The pulsed-voltage generators are normally used to produce a standard flash pulsed voltage of 1.2/50 in accordance with IEC 60-1 (1989), that is to say voltage pulses with a rise time of 1.2 $\mu$s±30% and a half-value fall time of 50 $\mu$s±20%. In order to comply with the specified rise time, the series resistors must be chosen to be so small for large load capacitances, that the flash pulsed voltage produced is a damped oscillation. Standard IEC 60-1 allows a maximum overshoot of 5% over the non-oscillating voltage profile. It follows from this that the theoretical maximum load capacitance, called the limit load capacitance from now on, of a pulsed-voltage generator results when the series resistors limit the overshoot to just 5% and the rise time reaches the upper tolerance limit of 1.56 $\mu$s. Any increase in the series resistors would reduce the overshoot but at the same time increase the rise time, while any reduction in the series resistors would shorten the rise time, but would increase the overshoot.

In order to increase the limit load capacitance of the Marx multiplier circuit, attempts have already been made to use a suitable arrangement of stages which can be charged to design the pulsed-voltage generator to have as little inductance as possible. For example, known items include a meandering arrangement of stages which can be charged, splitting the current in the generator into two opposite current paths, or arranging all the components to be physically very close. With a conventional open configuration, a low-inductance design of the pulsed-voltage generator can, however, influence only a portion of the total inductance, since the size of the outer loop, comprising the unit under test and the connecting lead, is governed by the separations required to cope with the voltage and the geometric size of the unit under test. Improvements here are now possible only to a minor extent.

However, from the user's point of view, there is a requirement for limit load capacitances which are higher than those of the known Marx multiplier circuits, for example for testing $SF_6$-insulated system parts. For transformer testing as well, the pulsed-voltage generator is often loaded with wound capacitances, which no longer allow the standard rise time.

In CH-A-376 999 a pulsed-voltage generator circuit which has a plurality of stages which can be charged is described, in which overvoltages which arise in the interior of the pulsed-voltage generator during the striking of the pulsed-voltage generator are reduced by additionally installed capacitances. The overshoot of the pulse fronts of the flash pulsed voltage across the load capacitance cannot be reduced by these additional capacitances alone.

From CH-A-238 586 a pulsed-voltage generator circuit is known which has a single stage which can be charged and has a surge capacitance and a switching spark gap, and which has an additional circuit element having connected in series a spark gap, a resistor and a capacitance. This additional circuit element serves for shortening the rise time of the produced pulsed voltage and does not suit for reducing the overshoot of the pulse fronts of a flash pulsed voltage across the load capacitance.

The invention is thus based on the object of providing a pulsed-voltage generator circuit of the type mentioned initially, by means of which a higher limit load capacitance can be achieved than with comparable, known circuits.

This object is achieved by the pulsed-voltage generator circuit according to the invention. An additional circuit element according to the invention, is a means by which the limit load capacitance of a pulsed-voltage generator circuit of the above-mentioned type can be increased.

SUMMARY OF THE INVENTION

The essence of the invention is that a pulsed-voltage generator circuit for producing a flash pulsed voltage for testing the capacitance of a unit under test, having a single stage or a plurality of stages which can be charged, it being possible to connect a load capacitance comprising among others the capacitance of the unit under test to the single stage or to the last stage, is provided with an additional circuit element for reducing the overshoot of the pulse fronts of the flash pulsed voltage across the load capacitance, which additional circuit element has a compensation capacitance and, connected in parallel with it, at least one discharge resistor or a discharge spark gap. The stage or each stage of the pulsed-voltage generator circuit which can be charged comprises, connected in series, a surge capacitance and a switching device, a parallel resistor connected in parallel with the surge capacitance and the switching device and, connected in series with the surge capacitance, the switching device and the parallel resistor, a series resistor, two stages if necessary being connected to one another such that they can be charged connected in parallel and can be discharged connected in series.

The additional circuit element does not reduce the cause of the overshoot, but compensates for the overshoot of the voltage across the load capacitance, that is to say in particular across the unit under test. The basic idea of the invention is to achieve a voltage reduction across the load capacitance during the overshoot, which voltage reduction is cancelled out after the overshoot decays. The overshoot is not generally reduced, but is compensated for such that no voltage spike occurs on the unit under test.

As a result of the reduction in overshoot of the pulse fronts of the flash pulsed voltage for the load capacitance, the limit load capacitance for the pulsed-voltage generator circuit according to the invention is considerably higher than for the previously known circuits, that is to say considerably larger unit under test capacitances can be tested.

The pulsed-voltage generator circuit according to the invention is described in more detail in the following text with reference to five exemplary embodiments and using the attached drawings, in which

Figure 1:
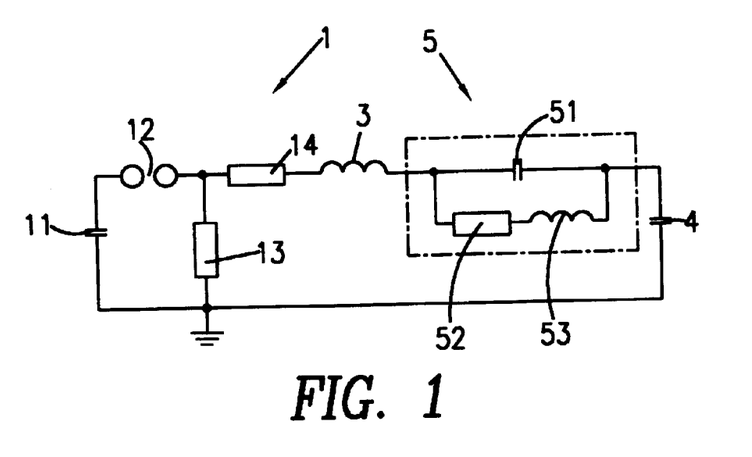
FIG. 1 shows an outline of a first circuit having a stage which can be charged and having an additional circuit element with a discharge resistor.

DETAILED DESCRIPTION OF THE FIGURES
FIG. 1

The illustrated test circuit comprises a pulsed-voltage generator circuit having a single stage 1 which can be charged and having an additional circuit element 5, as well as a load capacitance 4. The stage 1 which can be charged has, connected in series, a surge capacitance 11 and a switching spark gap 12, a parallel resistor 13 connected in parallel with the surge capacitance 11 and the switching spark gap 12 and, connected in series with the surge capacitance 11, the switching spark gap 12 and the parallel resistor 13, a series resistor 14.

The physical extent of the test arrangement results in the test circuit having unavoidable self-inductance 3 which, together with the load capacitance 4, forms an oscillatory circuit, which is damped by the series resistor 14.

The load capacitance 4 is composed of the capacitance of the unit under test, the capacitance of a capacitive pulsed-voltage divider (which reduces the flash pulsed voltage produced while the stage is being discharged to values which can be processed by measurement and recording devices) and parasitic capacitances which occur.

The additional circuit element 5 is arranged, connected in series, between the stage 1 which can be charged and the load capacitance 4, and comprises a compensation capacitance 51 and, connected in parallel with it, a discharge resistor 52, which is associated with a discharge resistor inductance 53.

In order to produce a flash pulsed voltage, the surge capacitance 11 is charged by means of a charging unit (which is not illustrated) and is then discharged by striking the switching spark gap 12. In this way, a voltage pulse is produced having a voltage profile which initially rises quickly (initial rise) and then decays slowly (falling edge), the compensation capacitance and the load capacitance 4 being charged during the initial rise. The decay, that is to say the falling edge of the voltage pulse, is produced by the joint discharging of the stage 1 which can be charged, of the additional circuit element 5 and of the load capacitance 4 via the parallel resistor 13.

In order to produce the standard flash pulsed voltage of 1.2/50 in accordance with IEC 60-1 (1989), the series resistor 14 for producing an adequately small initial rise time for large load capacitances 4 must be chosen to be so small that the flash pulsed voltage produced is a damped oscillation, a maximum overshoot of 5% in comparison with the non-oscillating voltage profile being permissible, which limits the maximum permissible load capacitance 4.

The reduction in the overshoot of the pulse fronts of the flash pulsed voltage produced for the load capacitance 4 is essentially brought about by the additional circuit element 5 in that, during the initial rise, the voltage is split between the compensation capacitance 51 and the load capacitance 4. After this, the overshoot decays and the compensation capacitance 51 is discharged via the discharge resistor 52. Once the compensation capacitance 51 has been discharged, the voltage split is cancelled and the voltage across the load capacitance 4 is then the difference between the oscillating voltage across the series circuit of the compensation capacitance 51 and of the load capacitance 4, and the pulsed voltage across the compensation capacitance 51.

By suitable selection of the compensation capacitance 51, of the discharge resistor 52 and of the discharge resistor inductance 53, and with the aid of the additional circuit element 5, the limit load capacitance of the present pulsed-voltage generator circuit can be approximately doubled.

The following statement applies to all of the following description. Where a figure includes reference numbers for the purpose of unambiguity in the drawing, but these are not explained in the directly associated descriptive text, then reference is made to where they are mentioned in the preceding figure descriptions.

Figure 2:
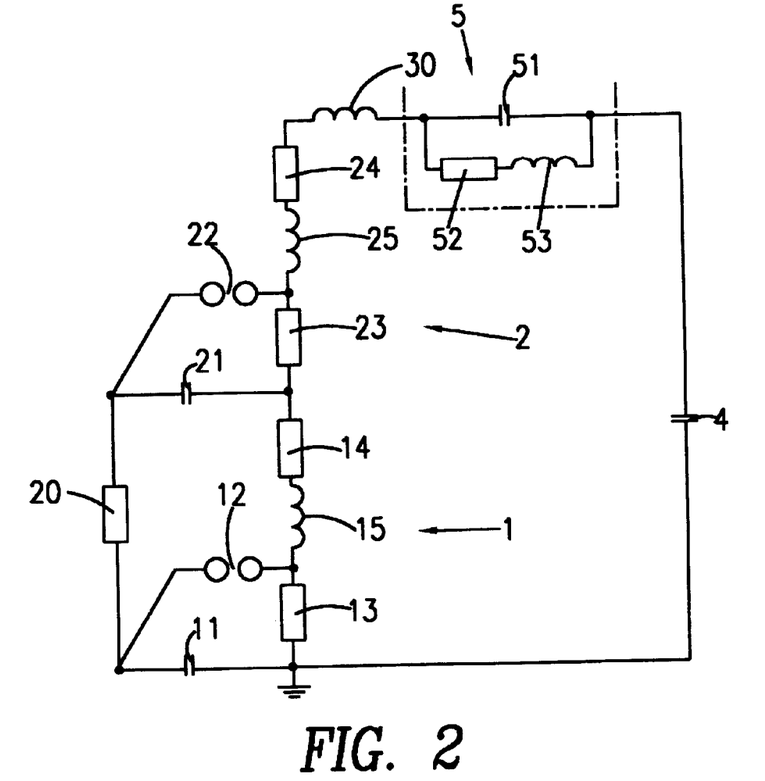
FIG. 2 shows an outline of a second circuit having two stages which can be charged and having an additional circuit element with a discharge resistor.

FIG. 2

The pulsed-voltage generator circuit in this second exemplary embodiment has two stages 1, 2 which can be charged and are essentially designed in a corresponding manner to the stage which can be charged that is illustrated in FIG. 1 and is explained in this context, in the second stage 2 which can be charged, the surge capacitance being designated 21, the switching spark gap 22, the parallel resistor 23 and the series resistor 24.

Instead of the self-inductance of the entire test circuit, the self-inductances 15, 25 of the two stages 1, 2 which can be charged, and the self-inducance 30 of the external loop, comprising the additional circuit element 5, the unit under test, the pulsed-voltage divider and the connecting leads, are quoted here.

The two stages 1, 2 which can be charged are connected to one another on the one hand via the series resistor 14 and on the other hand via a high-resistance charge resistor 20. During charging, they are charged, connected in parallel, directly or via the charge resistor 20 by means of a charging unit (which is not illustrated). Once the switching spark gaps 12 and 22 have been struck, they are discharged connected in series, the connection between the two stages 1, 2 being made via the series resistor 14, whose resistance is relatively low in comparison with the charge resistor 20.

The reduction in the overshoot of the pulse fronts of the flash pulsed voltage produced for the load capacitance 4 is produced by the additional circuit element 5 analogously to the first exemplary embodiment explained in conjunction with FIG. 1.

Figure 3:
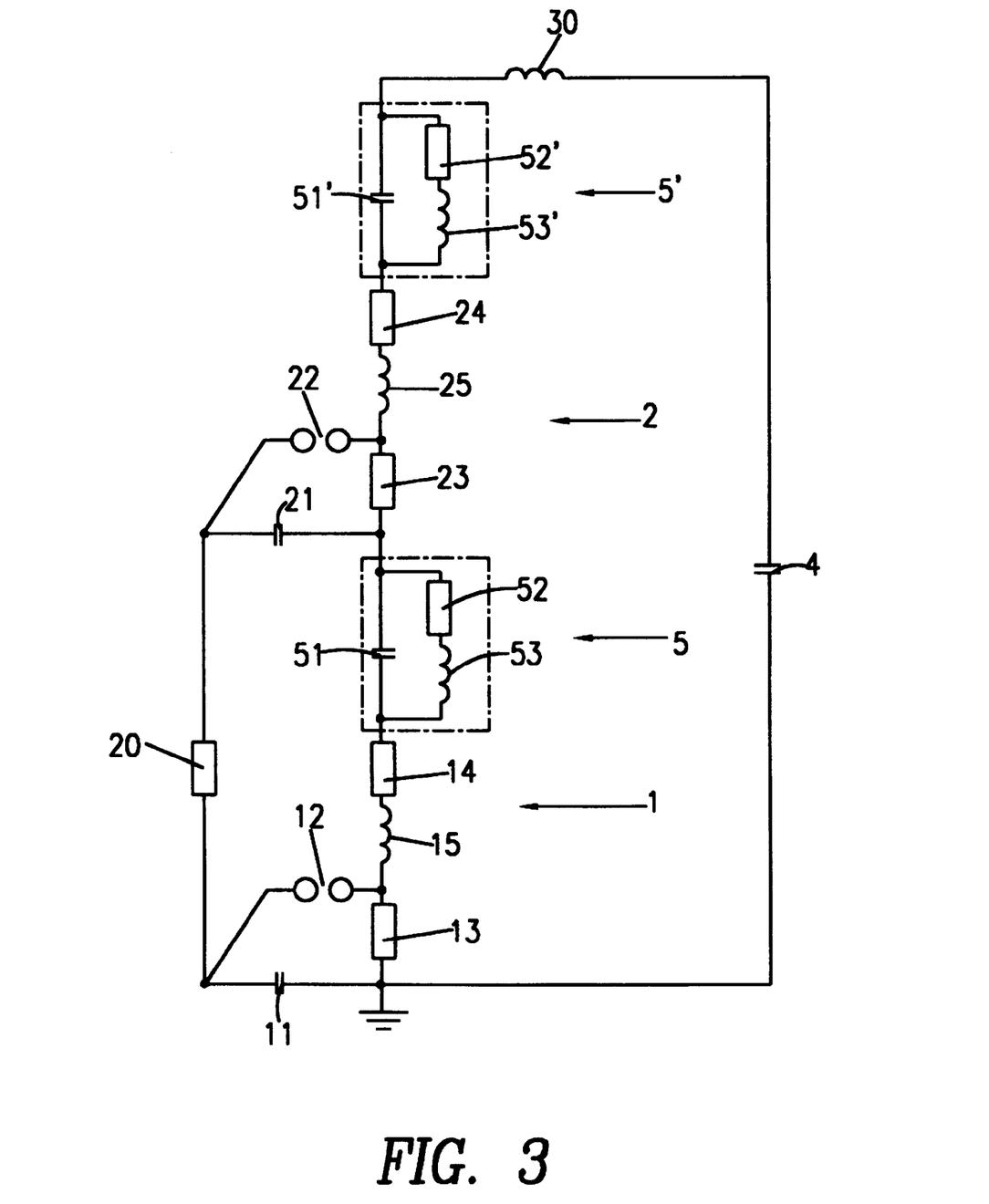
FIG. 3 shows an outline of a third circuit having two stages which can be charged, each stage being assigned an additional circuit element with a discharge resistor.

FIG. 3

In this third exemplary embodiment, the pulsed-voltage generator circuit is designed in a similar manner to that in the previous exemplary embodiment. The only difference is that, instead of a single additional circuit element arranged outside the actual pulsed-voltage generator, two correspondingly designed additional circuit elements 5, 5' are used, which are each arranged, connected in series, directly downstream of one of the stages 1, 2 which can be charged, the compensation capacitance in the additional circuit element 5' being designated 51', the discharge resistor being designated 52' and the discharge resistor inductance being designated 53'.

The reduction in the overshoot of the pulse fronts of the flash pulsed voltage produced across the load capacitance 4 is produced by the additional circuit elements 5, 5' analogously to the previous exemplary embodiments.

Figure 4:
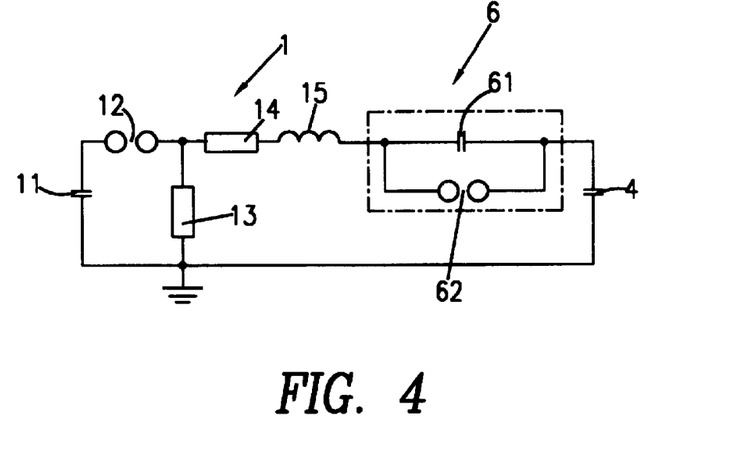
FIG. 4 shows an outline of a fourth circuit having a stage which can be charged and having an additional circuit element with a discharge spark gap.

FIG. 4

The illustrated, fourth exemplary embodiment corresponds to the first exemplary embodiment, except for the additional circuit element 6.

In this case, the additional circuit element 6 has a compensation capacitance 61 which is in general greater than the compensation capacitance 51 illustrated in FIG. 1 and, connected in parallel with it, a discharge spark gap 62 which can be triggered with a delay with respect to the striking of the switching spark gap 12.

The additional circuit element 6 operates in a similar manner to the first exemplary embodiment. During the initial rise of a voltage pulse that is produced, the series circuit formed by the compensation capacitance 61 and the load capacitance 4 is charged. The voltage is split between the compensation capacitance 61 and the load capacitance 4, and this reduces the overshoot of the pulse front for the load capacitance 4. The discharge spark gap 62 is triggered roughly on reaching the peak, as a result of which the compensation capacitance 61 is shorted and the voltage split is cancelled.

Figure 5:
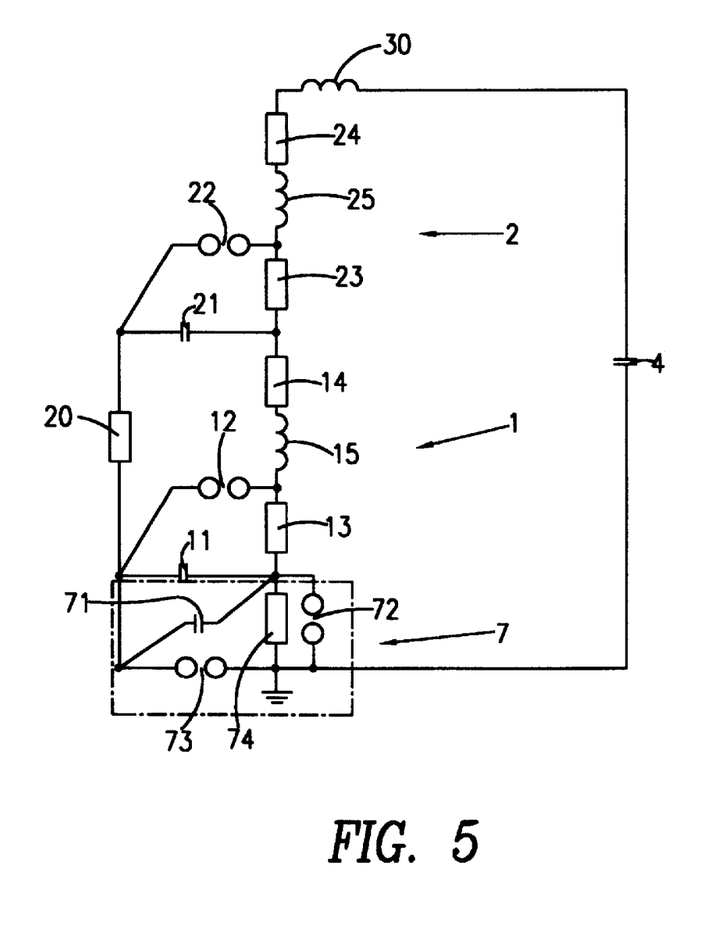
FIG. 5 shows an outline of a fifth circuit having two stages which can be charged and having an upstream additional circuit element with a discharge spark gap.

FIG. 5

The illustrated, fifth exemplary embodiment corresponds to the second exemplary embodiment, except for the additional circuit element.

Instead of an additional circuit element arranged between the second stage 2 which can be charged and the load capacitance 4, an additional circuit element 7 is in this case connected upstream of the first stage 1 which can be charged. The additional circuit element 7 has, connected in series, a compensation spark gap 73 and a compensation capacitance 71 and, connected in parallel with the compensation spark gap 73 and the compensation capacitance 71, a charge resistor 74 and a discharge spark gap 72.

While the two stages 1, 2 which can be charged are being charged, the compensation capacitance 71 is also charged via the charge resistor 74, which advantageously has a high resistance. While the stages 1, 2 which can be charged are being discharged, the compensation capacitance 71 is connected, in a first phase, by striking, that is to say triggering, of the compensation spark gap 73 such that the voltage on the stages 1, 2 which can be charged is reduced by the voltage on the compensation capacitance 71. In a second phase, which starts approximately when the voltage pulse that is produced reaches its peak, the compensation capacitance 71 is shorted by striking of the discharge spark gap 72, as a result of which the voltage reduction is cancelled.

Figure 6:
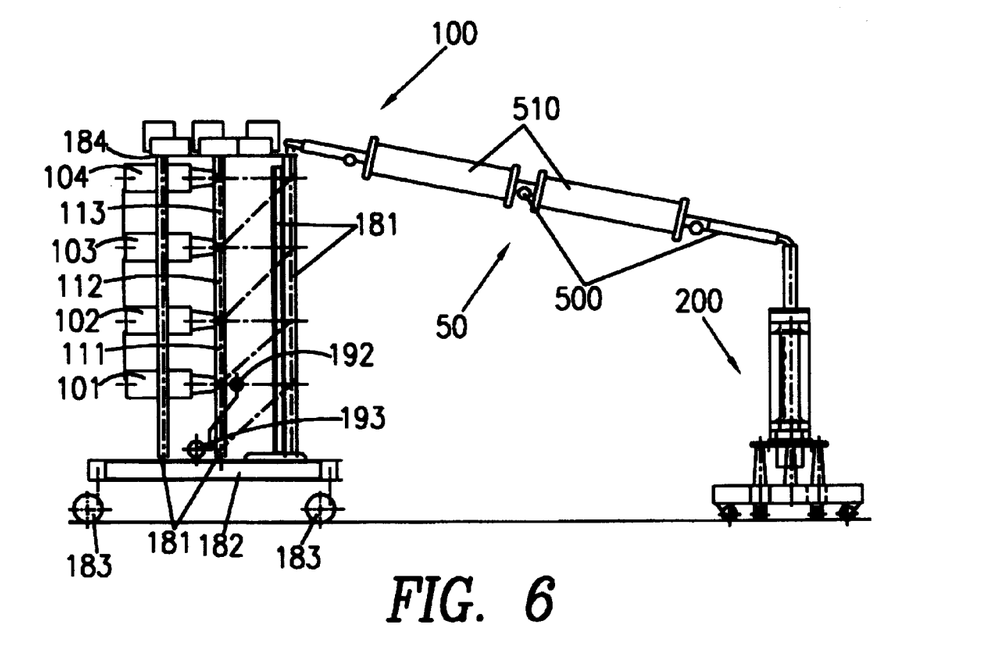
FIG. 6 shows a front view of a pulsed-voltage generator according to the invention having an additional circuit element in the form of an external additional element and a pulsed-voltage divider.
Figure 7:
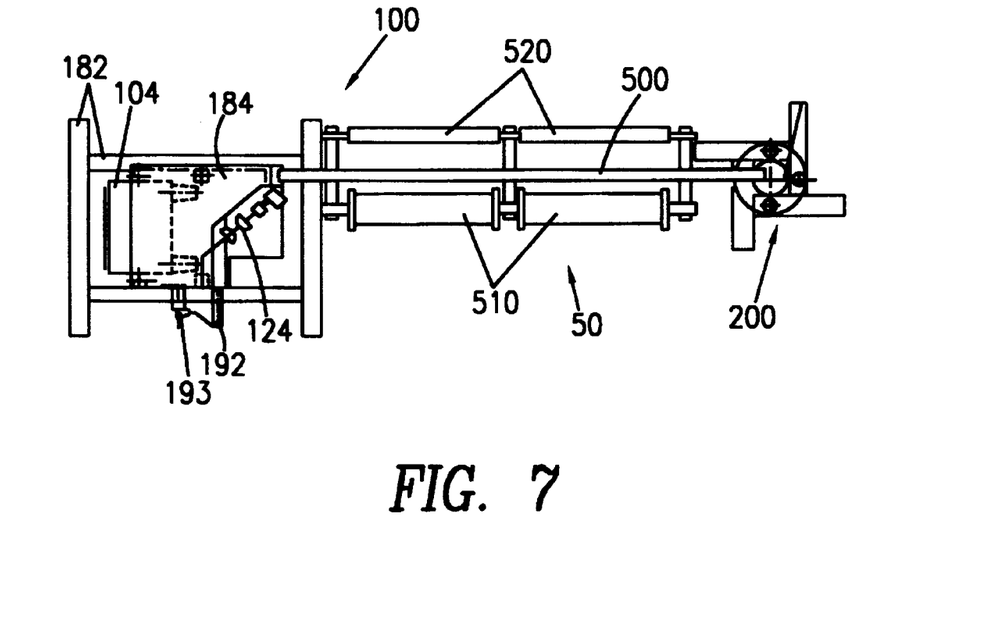
FIG. 7 shows a plan view of the pulsed-voltage generator with an additional circuit element and the pulsed-voltage divider from FIG. 6

FIGS. 6 and 7

The illustrated pulsed-voltage generator 100 according to the invention has an additional circuit element in the form of an external additional element 50, which can also be fitted retrospectively to already existing pulsed-voltage generators. One end of the external additional element 50 has connected to it a conventional, capacitive pulsed-voltage divider 200 (which is not described in more detail here) in order to reduce the flash pulsed voltage produced to values which can be processed by measurement and recording devices (which are not illustrated).

The pulsed-voltage generator 100 is designed with the circuit according to the second exemplary embodiment, but with four stages which can be charged instead of only two, having surge capacitances 101, 102, 103, 104 and charge resistors 111, 112, 113. The positions of the switching spark gaps, parallel resistors and series resistors are indicated by dashed-dotted lines in FIG. 6. The switching spark gap 124 in the fourth stage can be seen in FIG. 7. The surge capacitances 101, 102, 103, 104 are charged by a charging unit (which is not illustrated) via a charging unit connection 192. A charging switch 193 is used to discharge the surge capacitances 101, 102, 103, 104 when the pulsed-voltage generator 100 is switched off or when a safety circuit (which is not illustrated) is interrupted. The individual circuit elements are mounted on vertical supporting profiles 181, which are fitted on a base frame 182 that is provided with rollers 183. A cover plate 184 is arranged above the topmost stage.

The external additional element 50 has a two-element compensation capacitor 510, that is to say a compensation capacitance, and, connected in parallel with it, a two-element discharge resistor 520, these items being mounted on a mounting rack 500. One discharge resistor element is, for example, configured as a wire resistor, cross-wound on a cylindrical insulating tube. A modular configuration of the compensation capacitor 510 and of the discharge resistor 520 allows matching to different pulsed-voltage generators in a range of types. The mounting rack 500 is suspended between one of the vertical supporting profiles 181 of the pulsed-voltage generator 100 and the pulsed-voltage divider 200 but could, for example, also be mounted on separate insulating supports.

The following text contains a specific numerical example of the above pulsed-voltage generator 100. The pulsed-voltage generator 100 in this case has a sum charge voltage of 400 kV and a charge energy of 20 kJ and is equipped with series resistors of 12Ω per stage which can be charged. Matching to the unit under test capacitance is carried out by means of interchangeable, external series resistors. The inductance is about 2.5 µH per stage, while an inductance of 6 µH is assumed for the external connection for the unit under test. With a total test circuit inductance of 60 µH and without any external additional element 50, the maximum load capacitance (capacitances of the unit under test and of the pulsed-voltage divider 200 and parasitic capacitances) which could be tested in accordance with the Standard would be 15.5 nF, the external series resistors then being switched off.

The two elements of the compensation capacitor 510 of the external additional element 50 each have a capacitance of 32 nF and are designed for a pulsed voltage of at least 150 kV, which results in a capacitance of 16 nF for the compensation capacitor 510. The discharge resistor 520 has a total resistance of 24Ω and the discharge resistor inductance produced by the winding is 3 µH. Furthermore, the external additional element 50 includes internal series resistances of 0.5Ω per stage of the pulsed-voltage generator which can be charged, that is to say a total of 2Ω and, optionally, two external series resistors of 5Ω and 10Ω. With the internal series resistances and the external series resistor of 10Ω, the pulsed-voltage generator can be loaded, when complying with Standard IEC 60-1, up to a load capacitance of 25 nF, while the internal series resistances and the external series resistor of 5Ω allow it to be loaded up to a load capacitance of 31 nF and, with the internal series resistances on their own, up to a load capacitance of 36 nF.

Figure 8:
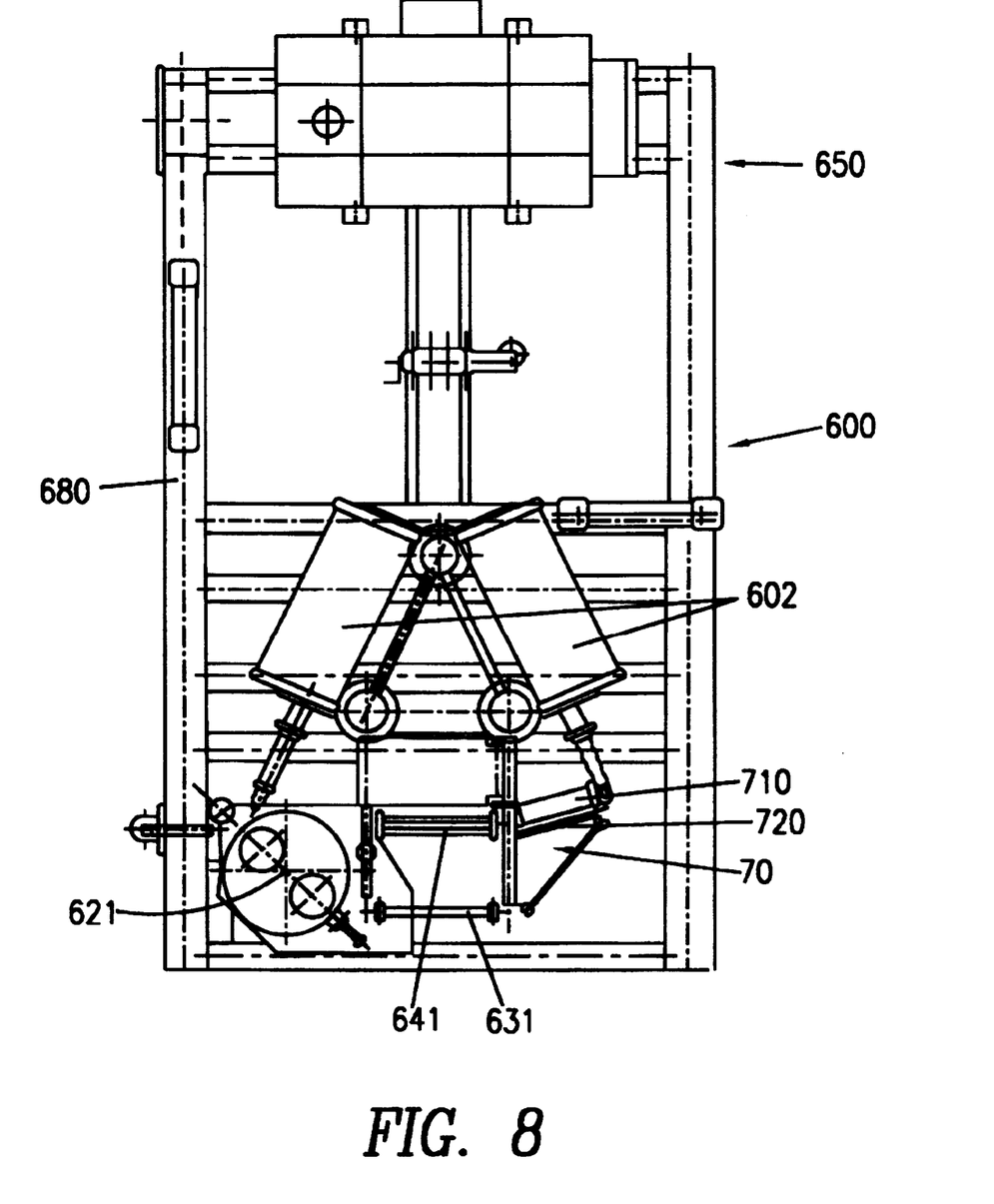
FIG. 8 shows a horizontal section through a pulsed-voltage generator according to the invention having additional circuit elements assigned to the individual stages which can be charged.

FIG. 8

The pulsed-voltage generator 600 according to the invention is designed with the circuit according to the third exemplary embodiment, but advantageously with more than two stages which can be charged. The illustrated surge capacitance 602 in one stage is configured as two elements and is connected to an additional circuit element 70 in the stage underneath. The additional circuit element 70 has a compensation capacitor 710, that is to say compensation capacitance, and, connected in parallel with it, a discharge resistor 720 which, for example, is configured as a wire resistor cross-wound on a flat insulating former. The additional circuit element 70 is connected to a switching spark gap 621 via series resistors 641. 631 designates the parallel resistor assigned to the switching spark gap 621, while the charge resistor for charging the surge capacitance 602 is not illustrated. A motor-driven earthing device 650 is provided for earthing the pulsed-voltage generator. The individual circuit elements are mounted on a mounting rack 608, which is preferably provided with rollers.

The following text contains a specific numerical example of the above pulsed-voltage generator 600. The pulsed-voltage generator 600 in this case has ten stages which can be charged, with a sum charge voltage of 2000 kV and a charge energy of 200 kJ, and is equipped with series resistors 641 of 46Ω, 30Ω and 22Ω per stage which can be charged. Matching to the unit under test capacitance is carried out by a suitable combination of series resistors in each stage, the smallest series resistance which can be achieved per stage for parallel connection of the three series resistors being 9.95Ω. Each stage then has an inductance of about 3.5 µH, while an inductance of 18 µH is assumed for the external connection for the unit under test. With a total test circuit inductance of 53 µH and without any additional circuit element 70, the maximum load capacitance (capacitances of the unit under test and of the pulsed-voltage divider and parasitic capacitances) which could be tested in accordance with the standard is 3.85 nF, three stages then being equipped with a parallel circuit formed by series resistors of 46Ω and 30Ω, and seven stages being equipped just with the series resistor of 22Ω, so that the total series resistance is 159Ω.

The compensation capacitor 710 of the additional circuit element 70 in each stage has a capacitance of 50 nF and is designed for a pulsed voltage of 180 kV. The discharge resistor 720 in each case is 8Ω, and the discharge resistor inductance produced by the winding is 1.5 µH. Furthermore, the additional circuit element 70 includes series resistors which make it possible to achieve a total series resistance of 10Ω, 20Ω, 30Ω, 55Ω or 70Ω. The pulsed-voltage generator can thus be loaded with a load capacitance of up to 10.5 nF while complying with Standard IEC 60-1.

Further design variations relating to the pulsed-voltage generators described above can be produced. In particular, the number of stages which can be charged can be varied without any problems.

What is claimed is:

1. A pulsed-voltage generator circuit for producing a flash pulsed voltage for testing the capacitance of a unit under test, comprising: at least one stage (1,2) which can be charged, said at least one stage (1, 2) having a surge capacitance (11, 21) and a switching device connected in series, a parallel resistor (13, 23) connected in parallel with the surge capacitance (11, 21) and the switching device, a series resistor (14, 24) connected in series with the surge capacitance, the switching device and the parallel resistor (13, 23), and a load capacitance (4), including the capacitance of the unit under test, connectable to said at least one stage (1, 2), said circuit having at least one additional circuit element (5, 5', 6, 7) which includes a compensation capacitance (51, 51', 61, 71) and at least one discharge element (52, 52', 62, 72) connected in parallel with the compensation capacitance (51, 51', 61, 71) to compensate for unwanted oscillatory overshoot of pulse fronts of the flashed pulsed voltage across the load capacitance (4).

2. A pulsed-voltage generator circuit according to claim 1, wherein the switching device is at least one switching spark gap (12, 22).

3. A pulsed-voltage generator circuit according to claim 1 or 2, wherein said at least one additional circuit element (5, 5', 6) is connected in series downstream of the series resistor (14, 24) in a stage (1, 2) which can be charged.

4. A pulsed-voltage generator circuit according to claim 3, wherein said at least one stage is a plurality of stages (1, 2) which can be charged, wherein said at least one additional circuit element (5, 5', 6) is connected in series downstream of the series resistor (14, 24) in the last of said at least one stage (1, 2) which can be charged.

5. A pulsed-voltage generator circuit according to claim 4, wherein one of said at least one additional circuit (5, 5', 6) is connected in series downstream of the series resistor (14, 24) in each said at least one stage (1, 2) which can be charged.

6. A pulsed-voltage generator circuit according to claim 1 or 2, wherein said at least one additional circuit element (7) is connected upstream of said at least one stage (1) which can be charged.

7. A pulsed-voltage generator circuit according to claim 6, wherein said at least one additional circuit element (7) has, connected in series, a compensation spark gap (73) and a compensation capacitance (71), and, connected in parallel with the compensation spark gap (73) and the compensation capacitance (71), a charge resistor (74) and a discharge spark gap (72), in such a manner that the compensation capacitance (71) is also charged while the downstream stage (1) which can be charged is being charged and, when the stage (1) which can be charged is being discharged, is connected in a first phase by striking of the compensation spark gap (73) such that the voltage on the stage (1) which can be charged is reduced by the voltage across the compensation capacitance (71) and, in a second phase, is shorted by striking the discharge spark gap (72).

8. A pulsed-voltage generator circuit according to claim 1, wherein the discharge spark gap (62, 72) can be triggered with a delay with respect to the tripping of the switching device by striking of the switching spark gap (12), of the associated stage (1) which can be charged.

9. A pulsed-voltage generator circuit according to claim 1, wherein said at least one stage (1, 2) includes a first stage (1) and a second stage (2), said first stage (1) and said second stage (2) connectable such that each can be charged connected in parallel and discharged connected in series.

10. The pulsed-voltage generator circuit of claim 1, wherein said at least one additional circuit element (5, 5', 6, 7) has at least one discharge resistor (52, 52') and in series at least one inductance (53, 53'), that are both connected in parallel with the compensation capacitance (51, 51', 61, 71), for compensating an unwanted oscillatory overshoot of pulse fronts of the flash pulsed voltage across the load capacitance (4).

11. The pulsed-voltage generator circuit of claim 1, wherein said at least one additional circuit element (5, 5', 6, 7) has at least one discharge spark gap (62, 72) connected in parallel with the compensation capacitance (51, 51', 61, 71) for compensating an unwanted oscillatory overshoot of pulse fronts of the flash pulsed voltage across the load capacitance (4).

12. An additional circuit element for a pulsed-voltage generator circuit which serves for producing a flash pulsed voltage for testing the capacitance of a unit under test and having at least one stage (1, 2) which can be charged, said at least one stage (1, 2) having, connected in series, a surge capacitance (11, 21) and a switching device, a parallel resistor (13, 23) connected in parallel with the surge capacitance (11, 21) and the switching device and, connected in series with the surge capacitance, the switching device and the parallel resistor, a series resistor (14, 24), two of said at least one stages (1, 2) being connectable to one another such that they can be charged connected in parallel and can be discharged connected in series, a load capacitance (4) including the capacitance of the unit under test being connectable to said at least one stage (1, 2), said pulsed-voltage generator circuit having at least one additional circuit element (5, 5', 6, 7) for reducing the overshoot of the pulse fronts of the flash pulsed voltage across the load capacitance (4), comprising:

a compensation capacitance (51, 51', 61, 71) and, connected in parallel with it, at least one discharge element (52, 52', 62, 72).

13. The additional circuit element according to claim 12, wherein said additional circuit element has, connected in series, a compensation capacitance (71) and a compensation spark gap (73) and, connected in parallel with the compensation capacitance (71) and the compensation spark gap (73), a charge resistor (74) and a discharge spark gap (72).

* * * * *

UNITED STATES PATENT AND TRADEMARK OFFICE
CERTIFICATE OF CORRECTION

PATENT NO. : 6,211,683 B1
DATED : April 3, 2001
INVENTOR(S) : Jurgen Wolf

It is certified that error appears in the above-identified patent and that said Letters Patent is hereby corrected as shown below:

<u>Title page,</u>
Item [73], Assignee, should be -- Haefely Test AG, Basel (CH) -- rather than "Trench Switzerland AG, Basel (CH)"

Signed and Sealed this

Fourteenth Day of October, 2003

JAMES E. ROGAN
*Director of the United States Patent and Trademark Office*